(12) United States Patent
Feng

(10) Patent No.: US 12,069,825 B2
(45) Date of Patent: Aug. 20, 2024

(54) FOLDING DISPLAY DEVICE

(71) Applicant: Wuhan China Star Optoelectronics Semiconductor Display Technology Co., Ltd., Wuhan (CN)

(72) Inventor: Zikang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/610,711

(22) PCT Filed: Jun. 8, 2021

(86) PCT No.: PCT/CN2021/098980
§ 371 (c)(1),
(2) Date: Nov. 12, 2021

(87) PCT Pub. No.: WO2022/252261
PCT Pub. Date: Dec. 8, 2022

(65) Prior Publication Data
US 2024/0090147 A1    Mar. 14, 2024

(30) Foreign Application Priority Data

Jun. 2, 2021 (CN) .......................... 202110615530.7

(51) Int. Cl.
*H05K 5/02* (2006.01)
*H10K 59/80* (2023.01)
(Continued)

(52) U.S. Cl.
CPC ........... *H05K 5/0226* (2013.01); *H10K 59/87* (2023.02); *E05D 3/06* (2013.01); *E05D 11/00* (2013.01);
(Continued)

(58) Field of Classification Search
CPC .......................... H05K 5/0017; H05K 5/0217
(Continued)

(56) References Cited

U.S. PATENT DOCUMENTS

2016/0085265 A1* 3/2016 Park .................... H04M 1/0268
361/807
2019/0033920 A1* 1/2019 Yun ....................... G06F 1/1641
(Continued)

FOREIGN PATENT DOCUMENTS

CN        107731100 A      2/2018
CN        108877529 A     11/2018
(Continued)

*Primary Examiner* — Hung S. Bui
(74) *Attorney, Agent, or Firm* — Nathan & Associates; Menachem Nathan

(57) ABSTRACT

The present application provides a folding display device. The folding display device comprises a bending mechanism and a front frame structure. The bending mechanism comprises a first support part and a second support part that are rotatably connected to one side of the bending part, and a third support part and a fourth support part that are rotatably connected to another side of the bending part. The front frame structure comprises a first front frame part connected to the first support part, a second front frame part connected to the second support part, a third front frame part connected to the third support part, and a fourth front frame part connected to the fourth support part.

20 Claims, 7 Drawing Sheets

(51) Int. Cl.
  *E05D 3/06*   (2006.01)
  *E05D 11/00*  (2006.01)
  *H10K 102/00* (2023.01)

(52) U.S. Cl.
  CPC ... *E05Y 2900/606* (2013.01); *H10K 2102/311* (2023.02)

(58) Field of Classification Search
  USPC ................. 361/807, 728, 755, 809, 810
  See application file for complete search history.

(56) References Cited

U.S. PATENT DOCUMENTS

| | | | |
|---|---|---|---|
| 2019/0265758 A1* | 8/2019 | Han | G06F 1/1681 |
| 2020/0175897 A1 | 6/2020 | Choi | |
| 2023/0209752 A1* | 6/2023 | Yun | G06F 1/1652 361/807 |
| 2023/0217616 A1* | 7/2023 | Park | G06F 1/1679 361/807 |

FOREIGN PATENT DOCUMENTS

| | | |
|---|---|---|
| CN | 208922656 U | 5/2019 |
| CN | 110570769 A | 12/2019 |
| CN | 110599907 A | 12/2019 |
| CN | 110675747 A | 1/2020 |
| CN | 111223402 A | 6/2020 |
| CN | 111447308 A | 7/2020 |
| CN | 111508367 A | 8/2020 |
| CN | 111681548 A | 9/2020 |
| CN | 111828462 A | 10/2020 |
| CN | 112015235 A | 12/2020 |
| CN | 112150921 A | 12/2020 |

\* cited by examiner

FOLDING DISPLAY DEVICE

BACKGROUND OF DISCLOSURE

Field of Disclosure

The present disclosure relates to a field of display technology, in particular to a folding display device.

Description of Prior Art

Currently, folding display devices have become a major direction of development in display industries. To resolve a problem that surfaces of a front mechanism and a back mechanism of an inner folding display device do not match a size of a flexible screen in a folding process of the inner folding display device, a support plate avoidance mechanism is generally designed in a folding mechanism of the inner folding display device, an avoidance action of the support plate reserves enough accommodation space for the flexible screen in a folded state, and the flexible screen forms a "water drop type" in a bending area. However, in this design, a relatively large gap is generated between an upper surface of the flexible screen in the bending area and a front frame, so that impurities such as dust enter an inside of the flexible screen from a side, and a problem of poor display of the flexible screen occurs.

A current folding display device has a problem that impurities enter the display device from a side gap of the display device, which causes poor display.

SUMMARY OF DISCLOSURE

The present disclosure provides a folding display device for alleviating a technical problem existing in a current folding display device that impurities enter an inside of the display device from a side gap of the display device, which causes poor display.

The present disclosure provides a folding display device, comprising:
  a housing, comprising a first housing and a second housing;
  a bending mechanism, wherein the bending mechanism is accommodated in the housing and is connected to the first housing and the second housing, and the bending mechanism comprises a bending part, a first support part and a second support part that are located on one side of the bending part and are disposed corresponding to the first housing, and a third support part and a fourth support part that are located on another side of the bending part and are disposed corresponding to the second housing, wherein the first support part is connected to the first housing, the second support part is rotatably connected to the first support part and one side of the bending part, the fourth support part is connected to the second housing, and the third support part is rotatably connected to the fourth support part and the another side of the bending part;
  a flexible display panel, wherein the flexible display panel is disposed in the housing and is located on one side of the first housing, the second housing, and the bending mechanism; and
  a front frame structure disposed on a side of the flexible display panel away from the housing and covering at least a part of an area of a side surface of the flexible display panel, wherein the front frame structure comprises a first front frame part connected to the first support part, a second front frame part connected to the second support part, a third front frame part connected to the third support part, and a fourth front frame part connected to the fourth support part.

In the folding display device of the present disclosure, a fixed interval is maintained between the second support part and the second front frame part, and a fixed interval is maintained between the third support part and the third front frame part.

In the folding display device of the present disclosure, the second front frame part comprises a first front end part and a first side end part, the first front end part is disposed corresponding to a light-emitting surface of the flexible display panel, and the first side end part is disposed corresponding to the side surface of the flexible display panel; and
  the third front frame part comprises a second front end part and a second side end part, the second front end part is disposed corresponding to the light-emitting surface of the flexible display panel, and the second side end part is disposed corresponding to the side surface of the flexible display panel.

In the folding display device of the present disclosure, the first side end part comprises a first extension part, the second front frame part is connected to the second support part through the first extension part, and the flexible display panel is disposed between the first extension part and the first front end part; and
  the second side end part comprises a second extension part, the third front frame part is connected to the third support part through the second extension part, and the flexible display panel is disposed between the second extension part and the second front end part.

In the folding display device of the present disclosure, further comprising a soft strip disposed on a light-emitting surface of the flexible display panel, wherein the soft strip is disposed between the front frame structure and the flexible display panel, and is separately connected to the first front frame part and the fourth front frame part.

In the folding display device of the present disclosure, the first front frame part has a first hook member, and a first end of the soft strip has a first opening that is matched and connected to the first hook member; and
  the fourth front frame part has a second hook member, and a second end of the soft strip has a second opening that is matched and connected to the second hook member.

In the folding display device of the present disclosure, the soft strip is further separately limitedly connected to the second front frame part and the third front frame part.

In the folding display device of the present disclosure, at least one first positioning post is disposed on the second front frame part, and the soft strip has first positioning holes that are matched and connected to each first positioning post; and
  at least one second positioning post is disposed on the third front frame part, and the soft strip has second positioning holes that are matched and connected to each second positioning post.

In the folding display device of the present disclosure, the folding display device further comprises a dust plug that is corresponding to the bending part and disposed on the side surface of the flexible display panel.

In the folding display device of the present disclosure, the dust plug comprises a body part and a hook part, the body part is disposed corresponding to the side surface of the flexible display panel, and the hook part is disposed on a side of the soft strip away from the flexible display panel.

In the folding display device of the present disclosure, the folding display device further comprises a rear cover corresponding to the bending part, and the rear cover is connected to the bending part; and the rear cover is located on a side of the bending mechanism away from the flexible display panel, and the body part of the dust plug is connected to the rear cover.

In the folding display device of the present disclosure, the front frame structure further comprises a first flexible part connected between the first front frame part and the second front frame part, a second flexible part connected between the second front frame part and the third front frame part, and a third flexible part connected between the third front frame part and the fourth front frame part.

In the folding display device of the present disclosure, at least one of the first flexible part, the second flexible part, or the third flexible part comprises a hard layer and a soft layer.

In the folding display device of the present disclosure, the soft layer is disposed between the hard layer and the flexible display panel.

In the folding display device of the present disclosure, a plurality of tooth grooves are disposed on a side of the hard layer close to the soft layer, and the soft layer is filled in the tooth grooves.

In the folding display device of the present disclosure, a cross-sectional shape of the tooth grooves comprises a square or a triangle.

In the folding display device of the present disclosure, the second support part comprises a plurality of second support sub-parts, and two adjacent second support sub-parts are rotatably connected; and the second front frame part comprises a plurality of second front frame sub-parts, and each of the second front frame sub-parts is connected to a corresponding second support sub-part; and the third support part comprises a plurality of third support sub-parts, and two adjacent third support sub-parts are rotatably connected; and the third front frame part comprises a plurality of third front frame sub-parts, and each of the third front frame sub-parts is connected to a corresponding third support sub-part.

In the folding display device of the present disclosure, the bending mechanism further comprises a first rotating member and a second rotating member that are rotatably connected to the bending part, a first torque member connected to the first rotating member and rotating with the first rotating member, a second torque member connected to the second rotating member and rotating with the second rotating member, a first sliding member fixedly connected to the first support part and slidably connected to the first torque member, and a second sliding member fixedly connected to the fourth support part and slidably connected to the second torque member; and the first sliding member is disposed on a side of the first support part away from the flexible display panel, the first torque member is disposed on a side of the second support part away from the flexible display panel, the second torque member is disposed on a side of the third support part away from the flexible display panel, and the second sliding member is disposed on a side of the fourth support part away from the flexible display panel.

In the folding display device of the present disclosure, the bending mechanism further comprises an intermediate support part movably connected to the bending part, and the intermediate support part is disposed between the bending part and the flexible display panel.

The present disclosure further provides a folding display device, comprising:

a housing comprising a first housing and a second housing;

a bending mechanism, wherein the bending mechanism is accommodated in the housing and is connected to the first housing and the second housing, and the bending mechanism comprises a bending part, a first support part and a second support part that are located on one side of the bending part and are disposed corresponding to the first housing, and a third support part and a fourth support part that are located on another side of the bending part and are disposed corresponding to the second housing, wherein the first support part is connected to the first housing, the second support part is rotatably connected to one side of the bending part and the first support part, the fourth support part is connected to the second housing, and the third support part is rotatably connected to another side of the bending part and the fourth support part;

a flexible display panel, wherein the flexible display panel is disposed in the housing and is located on one side of the first housing, the second housing, and the bending mechanism; and a front frame structure disposed on a side of the flexible display panel away from the housing and covering at least a part of a side surface of the flexible display panel, wherein the front frame structure comprises a first front frame part connected to the first support part, a second front frame part connected to the second support part, a third front frame part connected to the third support part, and a fourth front frame part connected to the fourth support part; and wherein a first flexible part is connected between the first front frame part and the second front frame part, a second flexible part is connected between the second front frame part and the third front frame part, a third flexible part is connected between the third front frame part and the fourth front frame part, a dust plug is disposed on a side of the second flexible part away from the flexible display panel, and a structure part of the dust plug is pressed on the second flexible part.

The present disclosure provides a folding display device. The folding display device comprises a housing, a bending mechanism disposed in the housing, a flexible display panel disposed in the housing and on the bending mechanism, and a front frame structure disposed on the flexible display panel. The bending mechanism comprises a first support part and a second support part that are rotatably connected to one side of a bending part, and a third support part and a fourth support part that are rotatably connected to another side of the bending part. The front frame structure comprises a first front frame part connected to the first support part, a second front frame part connected to the second support part, a third front frame part connected to the third support part, and a fourth front frame part connected to the fourth support part. In the present disclosure, the front frame structure of the folding display device is disposed in four parts, and each part is separately connected to a corresponding support part, so that the front frame structure of the folding display device always keeps a fixed interval from the flexible display panel in a bending process, thereby effectively blocking impurities from entering the display device, and improving reliability of the display device.

DESCRIPTION OF DRAWINGS

In order to more clearly explain technical solutions in the embodiments or in the prior art, the following will briefly introduce the drawings required in the description of the embodiments or in the prior art. Obviously, the drawings in the following description are only some embodiments of the present disclosure. For those skilled in the art, without paying any creative work, other drawings can be obtained based on these drawings.

DETAILED DESCRIPTION OF EMBODIMENTS

Figure 1:
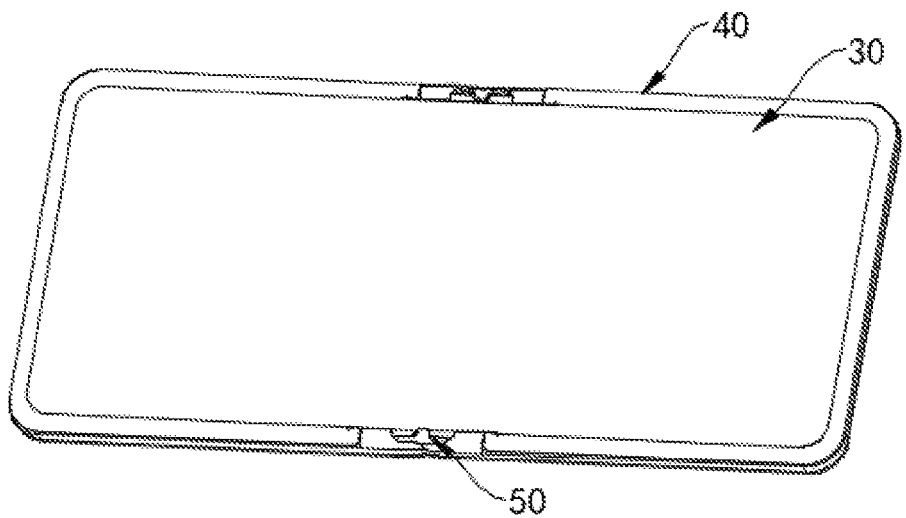
FIG. 1 is a schematic structural diagram of a folding display device according to an embodiment of the present disclosure.

Description of the following embodiments refers to the attached drawings to illustrate specific embodiments in which the present disclosure can be implemented. Directional terms mentioned in the present disclosure, such as [up], [down], [front], [back], [left], [right], [inner], [outer], [side], etc., are only directions of the attached drawings. Therefore, the directional terms used are used to describe and understand the present disclosure, rather than to limit the present disclosure. In the drawings, units with similar structures are indicated by same reference numerals.

An embodiment of the present disclosure provides a folding display device. The folding display device comprises a housing, a bending mechanism disposed in the housing, a flexible display panel disposed in the housing and on the bending mechanism, and a front frame structure disposed on the flexible display panel. The bending mechanism comprises a first support part and a second support part that are rotatably connected to one side of a bending part, and a third support part and a fourth support part that are rotatably connected to another side of the bending part. The front frame structure comprises a first front frame part connected to the first support part, a second front frame part connected to the second support part, a third front frame part connected to the third support part, and a fourth front frame part connected to the fourth support part. In this embodiment of the present disclosure, the front frame structure of the folding display device is disposed in four parts, and each part is separately connected to a corresponding support part, so that the front frame structure of the folding display device always keeps a fixed interval from the flexible display panel in a bending process, thereby effectively blocking impurities from entering the display device, and improving reliability of the display device.

The following describes features of the folding display device provided in the present disclosure with reference to specific embodiments.

Figure 2:
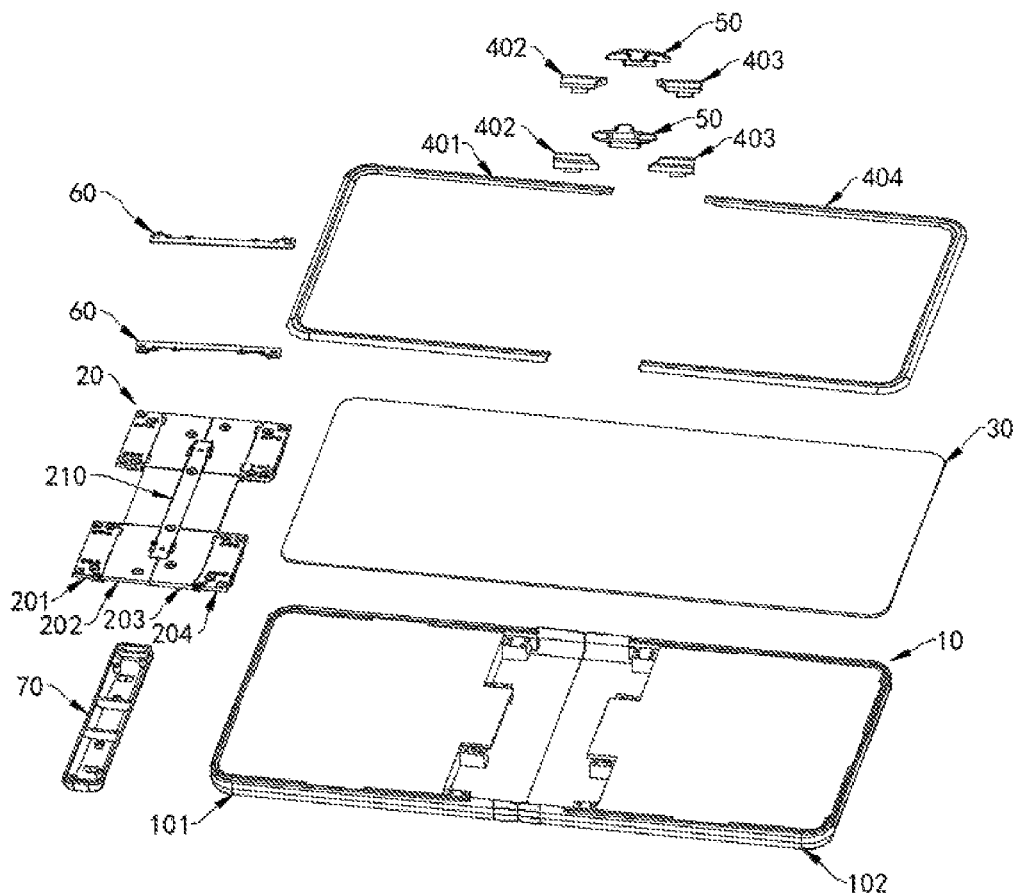
FIG. 2 is an exploded diagram of the folding display device according to the embodiment of the present disclosure.

Referring to FIG. 1 and FIG. 2, FIG. 1 is a schematic structural diagram of a folding display device according to an embodiment of the present disclosure. FIG. 2 is an exploded diagram of the folding display device according to an embodiment of the present disclosure.

The folding display device comprises a housing 10, a bending mechanism 20 disposed in the housing 10, a flexible display panel 30 disposed in the housing 10 and located on the bending mechanism 20, and a front frame structure 40 disposed on the flexible display panel 30. Wherein, the housing 10 and the bending mechanism 20 form a back support surface of the flexible display panel 30, so as to support the flexible display panel 30 in a transition between a flattened state and a fully folded state. The front frame structure 40 is disposed corresponding to a light-emitting surface of the flexible display panel 30, and is connected to the housing 10 and/or the bending mechanism 20, so as to fasten the flexible display panel 30 between the front frame structure 40 and the housing 10 and the bending mechanism 20.

The housing 10 comprises a first housing 101 and a second housing 102 that are disposed opposite to each other. Interface areas of the first housing 101 and the second housing 102 each have a recessed area, and the recessed area of the first housing 101 and the recessed area of the second housing 102 are butted to form an accommodating groove for accommodating the bending mechanism 20. Areas of the first housing 101, other than the recessed area, and areas of the second housing 102, other than the recessed area, respectively form support planes of the flexible display panel 30. Alternatively, the first housing 101 and the second housing 102 have a same size and shape, and the accommodating groove is correspondingly defined in a middle area of the housing 10.

The bending mechanism 20 is disposed in the accommodating groove enclosed by the first housing 101 and the second housing 102, and when the folding display device is in the fully flattened state, a surface of the bending mechanism 20 facing the flexible display panel 30 and a surface of the housing 10 facing the flexible display panel 30 are coplanar, so as to form the support plane of the flexible display panel 30.

The bending mechanism 20 is connected to the first housing 101 and the second housing 102.

Figure 3:
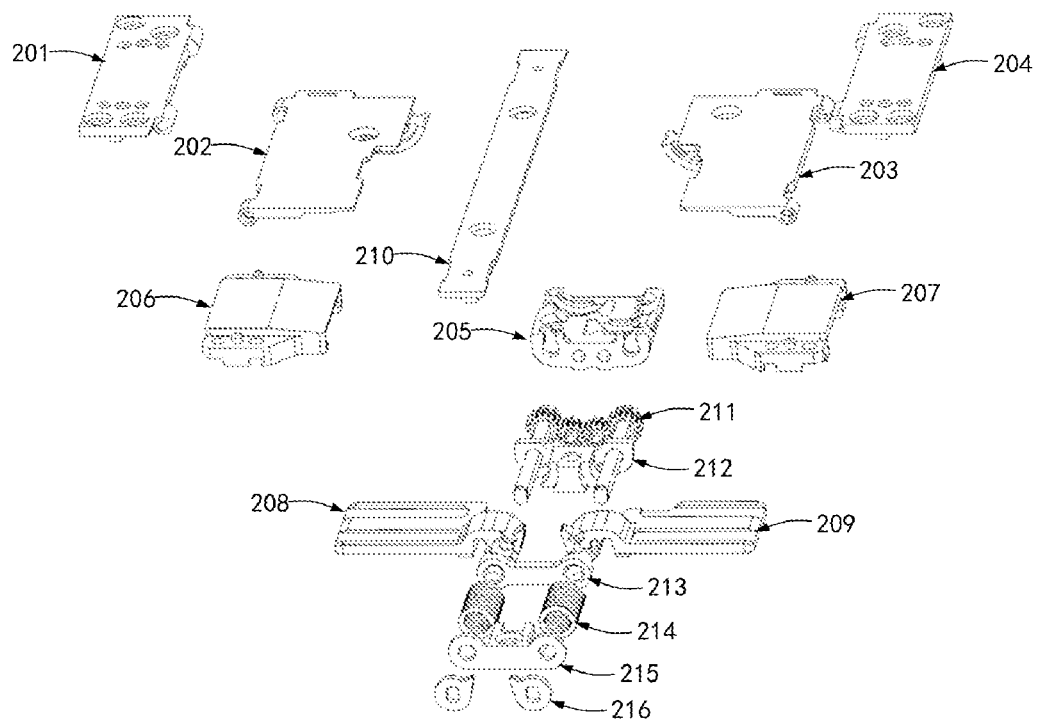
FIG. 3 is an exploded diagram of a bending mechanism according to an embodiment of the present disclosure.

Specifically, referring to FIG. 2 and FIG. 3, and FIG. 3 is an exploded diagram of the bending mechanism 20 according to an embodiment of the present disclosure. The bending mechanism 20 comprises a bending part 205, a first support part 201 and a second support part 202 that are located on one side of the bending part 205 and are correspondingly disposed on the first housing 101, and a third support part 203 and a fourth support part 204 that are located on another side of the bending part 205 and are correspondingly disposed on the second housing 102. The first support part 201 is connected to the first housing 101, the second support part 202 is separately rotatably connected to the first support part 201 and one side of the bending part 205, the fourth support part 204 is connected to the second housing 102, and the third support part 203 is separately rotatably connected to the fourth support part 204 and another side of the bending part 205.

Both the first support part 201 and the second support part 202 are sleeved on a rotating shaft (not shown in the figure), both the third support part 203 and the fourth support part 204 are sleeved on another rotating shaft (not shown in the figure), wherein, the second support part 202 and the first support part 201 are rotatably connected through the rotating shaft, and the third support part 203 and the fourth support part 204 are rotatably connected through the rotating shaft, and all the rotating shafts comprise, but are not limited to, pin shafts.

Alternatively, the second support part 202 comprises a plurality of second support sub-parts, and two adjacent second support sub-parts are rotatably connected to each other. The third support part 203 comprises a plurality of third support sub-parts, and two adjacent third support sub-parts are rotatably connected to each other. In a foregoing design of this embodiment, the second support part 202 and the third support part 203 are further designed as a rotatable connection structure of a plurality of support sub-parts, so that the bending mechanism 20 forms a fine water drop structure in the fully folded state.

In this embodiment, the second support part 202 and the first support part 201 are disposed on one side of the bending part 205, the third support part 203 and the fourth support part 204 are disposed on another side of the bending part 205, the second support part 202 is rotatably connected to one side of the bending part 205, and the third support part 203 is rotatably connected to another side of the bending part 205. The second support part 202 and the first support part 201, and the third support part 203 and the fourth support part 204 are rotatably connected through rotating shafts respectively, thereby increasing a quantity of rotational degrees of freedom of the folding mechanism. When the folding display device is in the folded state, the second support part 202, the first support part 201, the third support part 203, and the fourth support part 204 are inclined to form a wedge, and a larger accommodation space of a bending area is reserved for the flexible display panel 30 in the folded state in the folding display device.

The bending mechanism 20 further comprises a rotating member 211, a first torque member 208 and a second torque member 209 connected to the rotating member 211 and rotating with the rotating member 211, a first sliding member 206 slidably connected to the first torque member 208, and a second sliding member 207 slidably connected to the second torque member 209, wherein the first sliding member 206 is fixedly connected to the first support part 201, and the second sliding member 207 is fixedly connected to the fourth support part 204.

Wherein, the rotating member 211 is rotatably connected to the bending part 205. Alternatively, the rotating member 211 comprises four gear shafts that are sequentially meshed, and one end of each gear shaft is disposed in one rotating groove on the bending part 205. The first torque member 208 and the second torque member 209 are respectively connected to two outermost opposite gear shafts, and can rotate with the gear shafts.

The first torque member 208 comprises a first sliding part and a first connection end that extends from one end of the first sliding part, and the second torque member 209 comprises a second sliding part and a second connection end that extends from one end of the second sliding part. The first sliding part is slidably connected to the first sliding member 206, a hole through which the rotating member 211 passes is defined at the first connection end, the second sliding part is slidably mounted on the second sliding member 207, and a hole through which the rotating member 211 passes is defined at the second connection end.

A first sliding groove is defined on the first sliding member 206, a second sliding groove is disposed on the second sliding member 207, the first sliding part is slidably mounted in the first sliding groove, and the second sliding part is slidably mounted in the second sliding groove.

The bending part 205 comprises an arc-shaped sliding groove, the second support part 202 comprises a first slider, and the third support part 203 comprises a second slider, wherein the first slider and the second slider rotate in the arc-shaped slide groove.

The bending mechanism 20 further comprises an intermediate support part 210 movably connected to the bending part 205, and the intermediate support part 210 is disposed between the bending part 205 and the flexible display panel 30.

The bending mechanism 20 further comprises a support member 216 connected to the rotating member 211 and rotatable with the rotating member 211. When the folding display device is in the flattened state, the support member 216 supports the intermediate support part 210. Alternatively, the support member 216 may be a cam member. In a non-fully flattened state of the folding display device, a non-cam part of the support member 216 corresponds to the intermediate support part 210; and when the folding display device changes from a non-flattened state to the flattened state, the support member 216 rotates with the rotating member 211, and the cam part of the support member 216 gradually rises to support the intermediate support part 210, so as to raise the intermediate support part 210 in a final flattened state.

The bending mechanism 20 further comprises a support bracket 212, a torque cam 213, a spring 214, and a limiting bracket 215. The support bracket 212 is connected onto the rotating member 211 and does not rotate with the rotating member 211, and the support bracket 212 is located between the bending part 205 and the first torque member 208 and the second torque member 209. A cam structure that matches the first torque member 208 and the second torque member 209 is disposed on the torque cam 213, and the torque cam 213 is disposed on a side of the first torque member 208 and the second torque member 209 away from the support bracket 212. One end of the spring 214 abuts on the torque cam 213, and another end abuts on the limiting bracket 215. The support member 216 is disposed on a side of the limiting bracket 215 away from the spring 214.

Referring to FIG. 1 and FIG. 2, the folding display device further comprises a rear cover 70 disposed corresponding to the bending part 205, and the rear cover 70 is connected to the bending part 205. The rear cover 70 is disposed on a side of the bending mechanism 20 away from the flexible display panel 30. The rear cover 70 is configured to shield and protect the bending mechanism 20 when the folding display device is in a bent state.

The flexible display panel 30 is disposed in the housing 10 and is located on a same side of the first housing 101, the second housing 102, and the bending mechanism 20. The flexible display panel 30 is flexible and bendable at least in an area corresponding to the bending mechanism 20. The flexible display panel 30 may be an organic light-emitting diode display panel, or may be a display panel with a flexible characteristic in another form.

The front frame structure 40 is disposed on a side of the flexible display panel 30 away from the housing 10 and covers at least a part of a side surface of the flexible display panel 30. The front frame structure 40 comprises a first front frame part 401 connected to the first support part 201, a second front frame part 402 connected to the second support part 202, a third front frame part 403 connected to the third support part 203, and a fourth front frame part 404 connected to the fourth support part 204. Wherein, the second front frame part 402 may move with the second support part 202 without being limited by a motion status of the first front frame part 401. The third front frame part 403 may move with the third support part 203 without being limited by a motion state of the fourth front frame part 404.

Alternatively, the second front frame part 402 comprises a plurality of second front frame sub-parts, and each second front frame sub-part is connected to a corresponding second support sub-part. The third front frame part 403 comprises a plurality of third front frame sub-parts, and each third front frame sub-part is connected to a corresponding third support sub-part.

In this embodiment, the front frame structure 40 of the folding display device is disposed as four parts with certain independence, and each part is separately connected to a corresponding support part, so that the front frame structure 40 of the folding display device always maintains a fixed interval between the front frame structure 40 and the flexible display panel 30 in the bending process, thereby preventing that impurities from easily entering the display device due to an enlarged interval between the front frame structure and the flexible display panel in the bending process, effectively reducing a risk of the impurities entering the display device, and improving the reliability of the display device.

Further, since the first front frame part 401 is connected to the first support part 201, the second front frame part 402 is connected to the second support part 202, the third front frame part 403 is connected to the third support part 203, and the fourth front frame part 404 is connected to the fourth support part 204, a fixed interval is maintained between the first support part 201 and the first front frame part 401, a fixed interval is maintained between the second support part 202 and the second front frame part 402, a fixed interval is maintained between the third support part 203 and the third front frame part 403, and a fixed interval is maintained between the fourth support part 204 and the fourth front frame part 404, so as to ensure that the front frame structure 40 of the folding display device can effectively cover the flexible display panel 30 regardless of whether the folding display device is in the folded state or the flattened state, and block entry of external impurities.

In an embodiment, the folding display device further comprises a soft strip 60 disposed on a side of the flexible display panel 30. The soft strip 60 is disposed between the front frame structure 40 and the flexible display panel 30, and is separately connected to the second front frame part 402 and the third front frame part 403. The soft strip 60 is made of flexible materials. In the bending process of the folding display device, the soft strip 60 is bent with the flexible display panel 30, so as to further prevent external impurities from entering the display device.

Further, the folding display device further comprises a dust plug 50 disposed corresponding to the bending part 205, and the dust plug 50 is fixedly connected to the rear cover 70. The dust plug 50 is configured to further fasten the soft strip 60 to the flexible display panel 30, so as to improve dustproof efficiency of the soft strip 60. In addition, the dust plug 50 may also block some external impurities from entering an inside of the folding display device.

The following describes a manner of disposing the front frame structure 40, the soft strip 60, and the dust plug 50 with reference to a specific embodiment.

Figure 4:
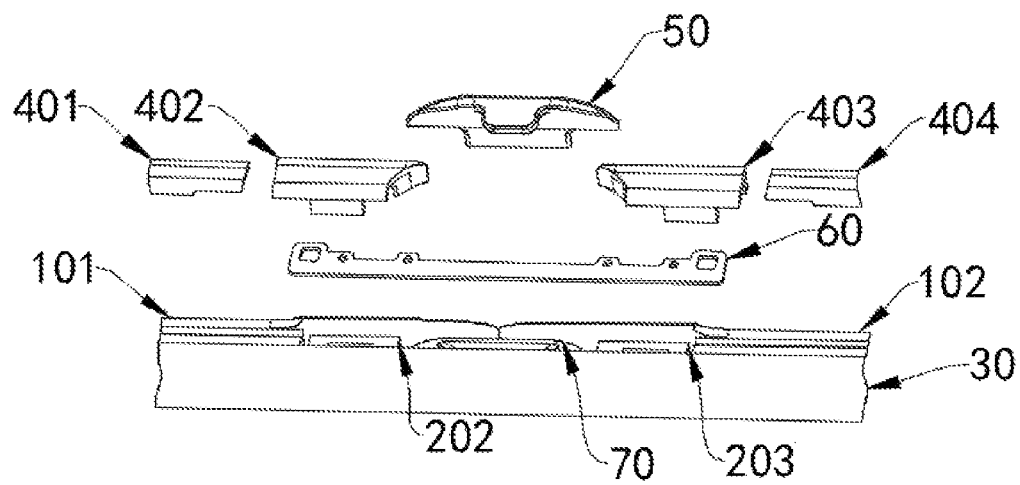
FIG. 4 is a combined exploded diagram of a front frame structure of the folding display device in a flattened state.
Figure 5:
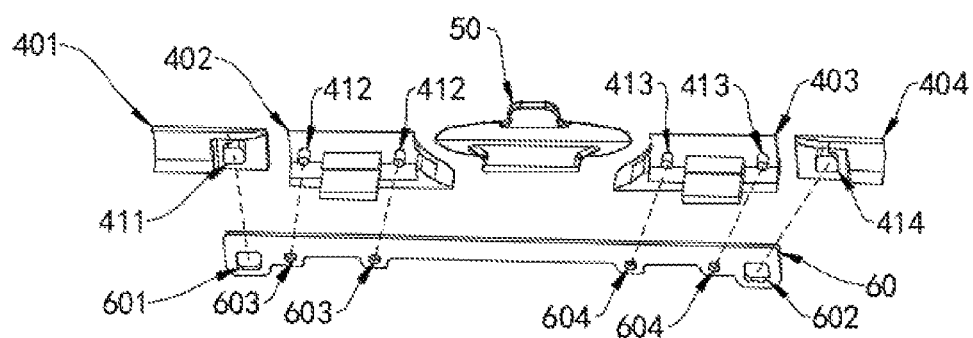
FIG. 5 is a schematic diagram of a connection structure of a front frame structure, a dust plug, and a soft strip in the folding display device.

Referring to FIG. 2, FIG. 4, and FIG. 5, FIG. 4 is a combined exploded diagram of the front frame structure in the folding display device in the flattened state. FIG. 5 is a schematic diagram of a connection structure of the front frame structure, the dust plug, and the soft strip in the folding display device.

In this embodiment, the first front frame part 401, the second front frame part 402, the third front frame part 403, and the fourth front frame part 404 in the front frame structure 40 are disposed as four front frame components that are independent of and separated from each other. However, it is not limited to this arrangement manner. In another embodiment, the first front frame part 401, the second front frame part 402, the third front frame part 403, and the fourth front frame part 404 may be connected to each other through a connection structure, so that the front frame structure 401 becomes an integral structure.

In addition, in this embodiment, the soft strip 60 is disposed as a component independent of the front frame structure 40. In another embodiment, the soft strip 60 may be integrally formed inside the front frame structure 40.

In this embodiment, the front frame structure 40 is disposed around an edge of the light-emitting surface of the flexible display panel 30, and at least a part of an area of the front frame structure 40 covers the side surface of the flexible display panel 30.

Figure 7:
FIG. 7 is a schematic structural diagram of a second front frame part and a third front frame according to an embodiment of the present disclosure.

Alternatively, further referring to FIG. 7, FIG. 7 is a schematic structural diagram of the second front frame part and the third front frame according to an embodiment of the present disclosure. The second front frame part 402 comprises a first front end part Q1 and a first side end part C1, the first front end part Q1 and the first side end part C1 are integrally formed, the first front end part Q1 is disposed corresponding to the light-emitting surface of the flexible display panel 30, and the first side end part C1 is disposed corresponding to the side surface of the flexible display panel 30. The third front frame part 403 comprises a second front end part Q2 and a second side end part C2, the second front end part Q2 and the second side end part C2 are integrally formed, the second front end part Q2 is disposed corresponding to the light-emitting surface of the flexible display panel 30, and the second side end part C2 is disposed corresponding to the side surface of the flexible display panel 30.

The first front end part Q1 and the first side end part C1 separately cover the light-emitting surface and the side surface of the flexible display panel 30, so as to form a structure covering the edge of the flexible display panel 30. The second front end part Q2 and the second side end part C2 also separately cover the light-emitting surface and the side surface of the flexible display panel 30, so as to form a structure covering the edge of the flexible display panel 30.

Further, the first side end part C1 comprises a first extension part S1, and the second front frame part 402 is connected to the second support part 202 through the first extension part S1. Alternatively, the first extension part S1 is a pin-shaped structure or a hook-shaped structure, and a hole-shaped structure corresponding to the first extension part S1 is defined on the second support part 202, so as to implement connection between the first extension part S1 and the second support part 202.

The second side end part C2 comprises a second extension part S2, and the third front frame part 403 is connected to the third support part 203 through the second extension part S2. Alternatively, the second extension part S2 is a pin-shaped structure or a hook-shaped structure, and a hole-shaped structure corresponding to the second extension part S2 is defined on the third support part 203, so as to implement connection between the second extension part S2 and the third support part 203.

In addition, the first front frame part 401 and the fourth front frame part 404 may be separately connected to the first support part 201 and the fourth support part 204 by a buckle structure, or may be connected to the first housing 101 and the second housing 102, so as to implement fastening of the first front frame part 401 and the fourth front frame part 404.

Further, the soft strip 60 is disposed along the edge of the light-emitting surface of the flexible display panel 30, and is located between the front frame structure 40 and the flexible display panel 30.

A first opening 601 and a second opening 602 are respectively disposed at opposite ends of the soft strip 60, a first hook member 411 is disposed at one end of the first front frame part 401 close to the second front frame part 402, a second hook member 414 is disposed at one end of the fourth front frame part 404 close to the third front frame part 403, the first hook member 411 is connected to one end of the soft strip 60 through the first opening 601, and the second hook member 414 is connected to another end of the soft strip 60 through the second opening 602, so that the soft strip 60 is connected between the first front frame part 401 and the fourth front frame part 404.

At least one first positioning hole 603 and at least one second positioning hole 604 are further disposed in an area between the first opening 601 and the second opening 602 of the soft strip 60, a first positioning post 412 corresponding to the first positioning hole 603 is disposed on the second front frame part 402, a second positioning post 413 corresponding to the second positioning hole 604 is disposed on the third front frame part 403, the first positioning post 412 is connected to the soft strip 60 through the first positioning hole 603, and the second positioning post 413 is connected to the soft strip 60 through the second positioning hole 604, so that the soft strip 60 is fastened between the front frame structure 40 and the flexible display panel 30.

Figure 6:
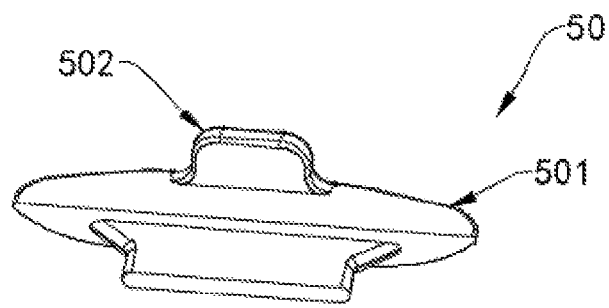
FIG. 6 is a schematic structural diagram of the dust plug according to the embodiment of the present disclosure.

Further referring to FIG. 6, FIG. 6 is a schematic structural diagram of the dust plug according to an embodiment of the present disclosure. The dust plug 50 comprises a body part 501 and a hook part 502, the body part 501 and the hook part 502 are integrally formed, and the hook part 502 protrudes from a contoured surface of the body part 501 to form a hook-shaped structure.

In an overall structure of the folding display device, the dust plug 50 is disposed corresponding to the bending part 205, and is located between the second front frame part 402 and the third front frame part 403. The body part 501 is disposed on the side surface of the flexible display panel 30, the hook part 502 is disposed corresponding to the light-emitting surface of the flexible display panel 30, and is located on a side of the soft strip 60 away from the flexible display panel 30. The body part 501 is fixedly connected to the rear cover 70 through an opening in the rear cover 70, so that the hook part 502 forms an extrusion fastening effect on the flexible display panel 30 and the soft strip 60.

Figure 8:
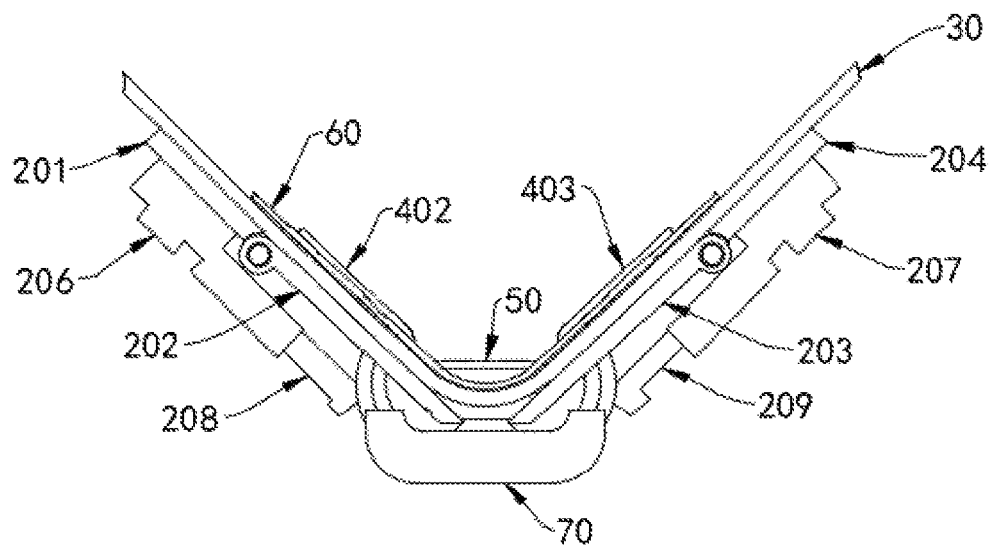
FIG. 8 is a schematic structural diagram of the folding display device from a first perspective in a bending process according to the embodiment of the present disclosure.
Figure 9:
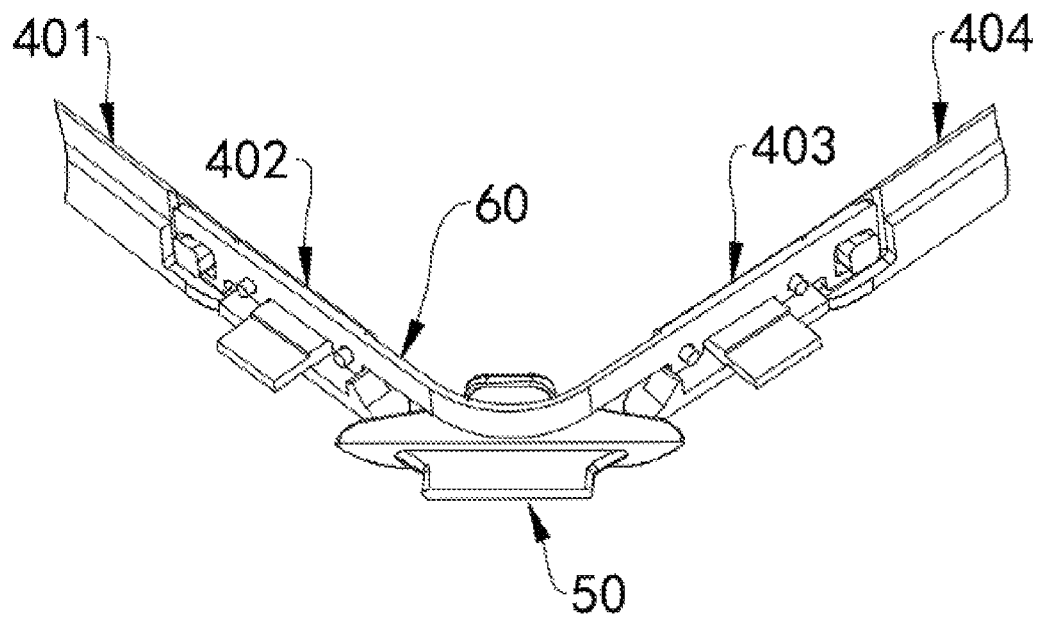
FIG. 9 is a schematic structural diagram of the folding display device from a second perspective in the bending process according to the embodiment of the present disclosure.

Further, referring to FIG. 8 and FIG. 9, FIG. 8 is a schematic structural diagram of the folding display device from a first perspective in the bending process according to the embodiment of the present disclosure, and FIG. 9 is a schematic structural diagram of the folding display device from a second perspective in the bending process according to the embodiment of the present disclosure.

In a bending process in which the folding display device is bent from the fully flattened state to the fully folded state, an interval between the front frame structure 40 and the flexible display panel 30 is always kept constant, in particular, an interval between the second front frame part 402 and the third front frame part 403 and the flexible display panel 30 is kept constant. It should be understood that, by connecting the second front frame part 402 and the second support part 202, and connecting the third front frame part 403 and the third support part 203, the second front frame part 402 is limited to move synchronously with the second support part 202, and the third front frame part 403 moves synchronously with the third support part 203, so as to prevent an increase in the interval between the front frame structure 40 and the flexible display panel 30 in the bending process.

In the bending process of the folding display device, the soft strip 60 is always fixed between the front frame structure 40 and the flexible display panel 30, so as to further prevent external impurities from entering the display device from the side surface of the flexible display panel 30.

In the bending process of the folding display device, the dust plug 50 is always pressed against the soft strip 60, so as to limit an increase in an interval between a middle area of the soft strip 60 and the flexible display panel 30, and further improve blocking capability of a side surface of the folding display device for external impurities.

Figure 10:
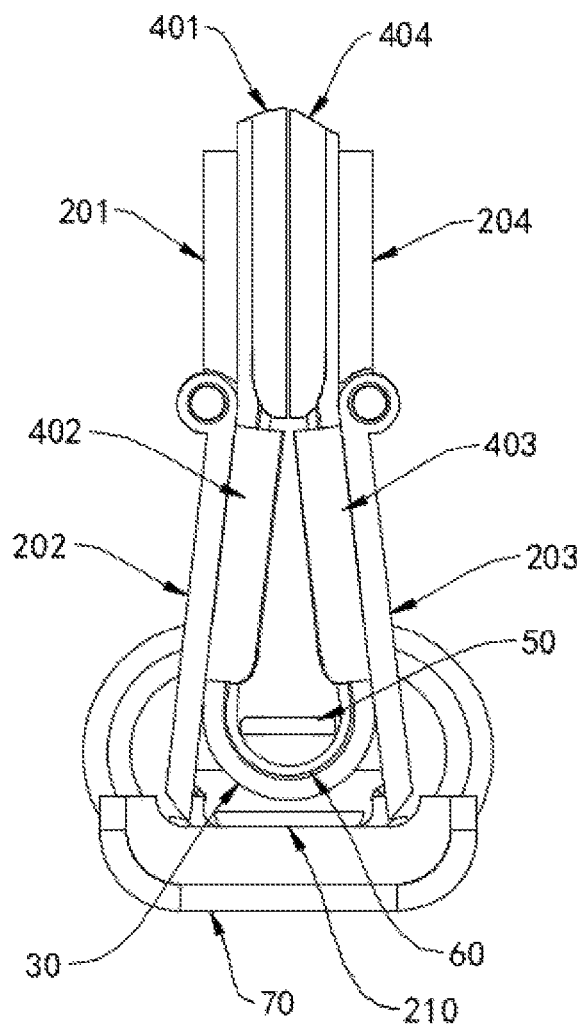
FIG. 10 is a schematic structural diagram of the folding display device in a fully folded state according to the embodiment of the present disclosure.

Further referring to FIG. 10, FIG. 10 is a schematic structural diagram of the folding display device in the fully folded state according to the embodiment of the present disclosure.

When the folding display device is in the fully folded state, the first support part 201 and the fourth support part 204 are in a parallel state or nearly parallel state; and there is a certain inclination angle between the second support part 202 and the third support part 203, so as to form a wedge-shaped accommodation space. Under a supporting action of the bending mechanism 20, the bending area of the flexible display panel 30 forms a water drop structure.

The first front frame part 401, the second front frame part 402, the third front frame part 403, and the fourth front frame part 404 fasten the flexible display panel 30 and the flexible strip 60 in the folded state to the bending mechanism 20 through connection relationship with the first support part 201, the second support part 202, the third support part 203, and the fourth support part 204, respectively. The dust plug 50 fastens the flexible display panel 30 and the soft strip 60 to the intermediate support part 210 through a connection relationship between the dust plug 50 and the rear cover 70.

In the foregoing embodiments, the soft strip 60 is described as a separate component independent of the front frame structure 40. However, this structure is not limited to this. In some other embodiments, the soft strip 60 may be integrally formed with the first front frame part 401 and the fourth front frame part 404 to form a part of a soft area in the front frame structure 40, and a same technical effect as that in the foregoing embodiments is achieved. In addition, another structural feature of the folding display device is same as that in the foregoing embodiments, and details are not described here again.

Figure 11:
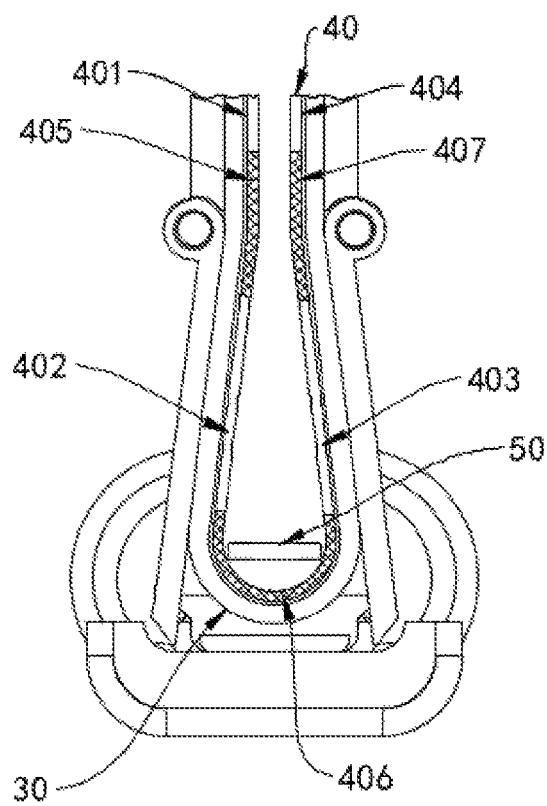
FIG. 11 is a schematic diagram of another embodiment of a folding display device according to an embodiment of the present disclosure.

In some other embodiments, referring to FIG. 11, FIG. 11 is a schematic diagram of another embodiment of a folding display device according to an embodiment of the present disclosure. In this embodiment, the folding display device has a same or similar structural feature as the folding display device in the foregoing embodiment, and a difference merely lies in a feature of the front frame structure 40. The following describes a difference between this embodiment and the foregoing embodiment. For omitted parts or parts that are not described in detail, refer to descriptions in the foregoing embodiment.

In this embodiment, the front frame structure 40 is disposed on the side of the flexible display panel away from the bending mechanism. The front frame structure 40 comprises the first front frame part 401, the second front frame part 402, the third front frame part 403, the fourth front frame part 404, a first flexible part 405 connected between the first front frame part 401 and the second front frame part 402, a second flexible part 406 connected between the second front frame part 402 and the third front frame part 403, and a third flexible part 407 connected between the third front frame part 403 and the fourth front frame part 404. During a process in which the folding display device changes from the fully flattened state to the bent state, the first flexible part 405, the second flexible part 406, and the third flexible part 407 are pressed close to the flexible display panel 30, and are bent together with the flexible display panel 30, so as to ensure that there is a fixed interval between the front frame structure 40 and the flexible display panel 30, and further prevent external impurities from entering the display device in the bending process.

Figure 12:
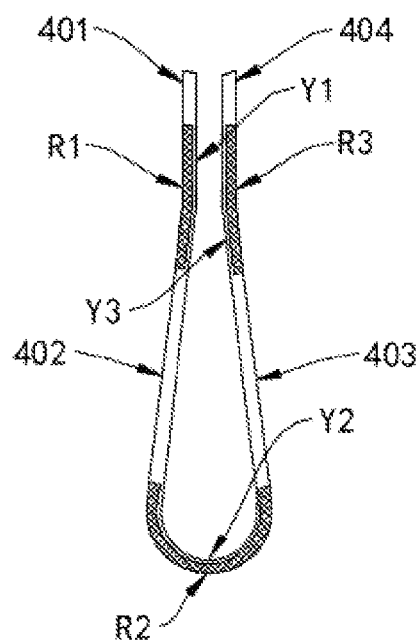
FIG. 12 is a schematic diagram of another embodiment of a front frame structure according to an embodiment of the present disclosure.

Alternatively, further referring to FIG. 12, FIG. 12 is a schematic diagram of another embodiment of a front frame structure according to an embodiment of the present disclosure. The first flexible part 405 comprises a first hard layer Y1 and a first soft layer R1, the first hard layer Y1 and the first soft layer R1 are distributed in a stacked manner, and the first soft layer R1 is located between the first hard layer Y1 and the flexible display panel. The second flexible part 406 comprises a second hard layer Y2 and a second soft layer R2, the second hard layer Y2 and the second soft layer R2 are distributed in a stacked manner, and the second soft layer R2 is located between the second hard layer Y2 and the flexible display panel. The third flexible part 407 comprises a third hard layer Y3 and a third soft layer R3, the third hard layer Y3 and the third soft layer R3 are distributed in a stacked manner, and the third soft layer R3 is located between the third hard layer Y3 and the flexible display panel 30.

Alternatively, the first hard layer Y1, the second hard layer Y2, and the third hard layer Y3 are integrally formed with the first front frame part 401, the second front frame part 402, the third front frame part 403, and the fourth front frame part 404 by a same material. The first soft layer R1, the second soft layer R2, and the third soft layer R3 are all made of flexible materials, so as to implement a bendable characteristic.

Figure 13:
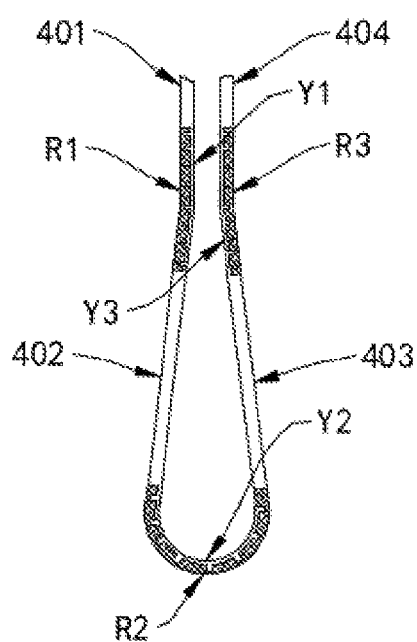
FIG. 13 is a schematic diagram of still another embodiment of a front frame structure according to an embodiment of the present disclosure.

Alternatively, further referring to FIG. 13, FIG. 13 is a schematic diagram of still another embodiment of a front frame structure according to an embodiment of the present disclosure. The first flexible part 405 comprises a first hard layer Y1 and a first soft layer R1 that are disposed in a stack, and the first soft layer R1 is located between the first hard layer Y1 and the flexible display panel 30. The second flexible part 406 comprises a second hard layer Y2 and a second soft layer R2 that are disposed in a stacked manner, and the second soft layer R2 is located between the second hard layer Y2 and the flexible display panel 30. The third flexible part 407 comprises a third hard layer Y3 and a third soft layer R3 that are disposed in a stacked manner, and the third soft layer R3 is located between the third hard layer Y3 and the flexible display panel 30.

A plurality of first tooth grooves are disposed on a side of the first hard layer Y1 close to the first soft layer R1, and the first soft layer R1 is filled in the first tooth grooves; a plurality of second tooth grooves are disposed on a side of the second hard layer Y2 close to the second soft layer R2, and the second soft layer R2 is filled in the second tooth grooves; and a plurality of third tooth grooves are disposed on a side of the third hard layer Y3 close to the third soft layer R3, and the third soft layer R3 is filled in the third tooth grooves.

It should be understood that, compared with the embodiment shown in FIG. 12, in this embodiment, in addition to a flexible bendable characteristic of the first flexible part 405, the second flexible part 406, and the third flexible part 407, a binding force between the first hard layer Y1 and the first soft layer R1, a binding force between the second hard layer Y2 and the second soft layer R2, and a binding force between the third hard layer Y3 and the third soft layer R3 may also be increased.

Alternatively, a cross-sectional shape of the first tooth grooves, the second tooth grooves, and the third tooth grooves may be a square shape, a triangle shape, or other shapes.

The first hard layer Y1, the second hard layer Y2, and the third hard layer Y3 may be integrally formed with the first front frame part 401, the second front frame part 402, the third front frame part 403, and the fourth front frame part 404 by a same material. The first soft layer R1, the second soft layer R2, and the third soft layer R3 are all made of flexible materials, so as to implement a bendable characteristic of the first soft layer R1, the second soft layer R2, and the third soft layer R3.

In summary, the folding display device provided in this embodiment of the present disclosure comprises the housing, the bending mechanism disposed in the housing, the flexible display panel disposed in the housing and on the bending mechanism, and the front frame structure disposed on the flexible display panel. The bending mechanism comprises the first support part and the second support part that are rotatably connected to one side of the bending part, and the third support part and the fourth support part that are rotatably connected to another side of the bending part. The front frame structure comprises the first front frame part connected to the first support part, the second front frame part connected to the second support part, the third front frame part connected to the third support part, and the fourth front frame part connected to the fourth support part. The soft strip may be disposed between the front frame structure and the flexible display panel, or the flexible part is connected between each part of the front frame structure. In this embodiment of the present disclosure, the front frame structure of the folding display device is disposed in four parts, and each part is separately connected to a corresponding support part, so that the front frame structure of the folding display device always maintains the fixed interval between the front frame structure and the flexible display panel in the bending process, thereby effectively blocking impurities from entering the display device. In addition, the soft strip or the flexible part is disposed to further improve the blocking capability of the front frame structure for impurities, and further improve the reliability of the display device.

It should be noted that, although the present disclosure discloses the foregoing specific embodiments, the foregoing embodiments are not intended to limit the present disclosure. Those of ordinary skilled in the art may make various changes and polish without departing from the spirit and scope of the present disclosure. Therefore, protection scope of the present disclosure is subject to the scope defined in the claims.

What is claimed is:

1. A folding display device, comprising:
a housing, comprising a first housing and a second housing;
a bending mechanism, wherein the bending mechanism is accommodated in the housing and is connected to the first housing and the second housing, and the bending mechanism comprises a bending part, a first support part, and a second support part located on one side of the bending part and are disposed corresponding to the first housing, and a third support part and a fourth support part located on another side of the bending part and are disposed corresponding to the second housing, wherein the first support part is connected to the first housing, the second support part is rotatably connected to the first support part and one side of the bending part, the fourth support part is connected to the second housing, and the third support part is rotatably connected to the fourth support part and the another side of the bending part;
a flexible display panel, wherein the flexible display panel is disposed in the housing and is located on one side of the first housing, the second housing, and the bending mechanism; and
a front frame structure disposed on a side of the flexible display panel away from the housing and covering at least a part of an area of a side surface of the flexible display panel, wherein the front frame structure comprises a first front frame part connected to the first support part, a second front frame part connected to the second support part, a third front frame part connected to the third support part, and a fourth front frame part connected to the fourth support part; the first front frame part, the second front frame part, the third front frame part, and the fourth front frame part are independent of each other, the second front frame part is configured to move with the second support part without being limited by a motion status of the first front frame part, and the third front frame part is configured to move with the third support part without being limited by a motion state of the fourth front frame part.

2. The folding display device according to claim 1, wherein a fixed interval is maintained between the second support part and the second front frame part, and a fixed interval is maintained between the third support part and the third front frame part.

3. The folding display device according to claim 2, wherein the second front frame part comprises a first front end part and a first side end part, the first front end part is disposed corresponding to a light-emitting surface of the flexible display panel, and the first side end part is disposed corresponding to the side surface of the flexible display panel; and
the third front frame part comprises a second front end part and a second side end part, the second front end part is disposed corresponding to the light-emitting surface of the flexible display panel, and the second side end part is disposed corresponding to the side surface of the flexible display panel.

4. The folding display device according to claim 3, wherein the first side end part comprises a first extension part, the second front frame part is connected to the second support part through the first extension part, and the flexible display panel is disposed between the first extension part and the first front end part; and
the second side end part comprises a second extension part, the third front frame part is connected to the third support part through the second extension part, and the flexible display panel is disposed between the second extension part and the second front end part.

5. The folding display device according to claim 1, further comprising a soft strip disposed on a light-emitting surface of the flexible display panel, wherein the soft strip is disposed between the front frame structure and the flexible display panel, and is separately connected to the first front frame part and the fourth front frame part.

6. The folding display device according to claim 5, wherein the first front frame part has a first hook member, and a first end of the soft strip has a first opening that is matched and connected to the first hook member; and
the fourth front frame part has a second hook member, and a second end of the soft strip has a second opening that is matched and connected to the second hook member.

7. The folding display device according to claim 5, wherein the soft strip is further limitedly connected to the second front frame part and the third front frame part separately.

8. The folding display device according to claim 7, wherein at least one first positioning post is disposed on the second front frame part, and the soft strip has first positioning holes that are matched and connected to each first positioning post; and
at least one second positioning post is disposed on the third front frame part, and the soft strip has second positioning holes that are matched and connected to each second positioning post.

9. The folding display device according to claim 5, wherein the folding display device further comprises a dust plug corresponding to the bending part and disposed on the side surface of the flexible display panel.

10. The folding display device according to claim 9, wherein the dust plug comprises a body part and a hook part, the body part is disposed corresponding to the side surface of the flexible display panel, and the hook part is disposed on a side of the soft strip away from the flexible display panel.

11. The folding display device according to claim 10, wherein the folding display device further comprises a rear cover corresponding to the bending part, and the rear cover is connected to the bending part; and
the rear cover is located on a side of the bending mechanism away from the flexible display panel, and the body part of the dust plug is connected to the rear cover.

12. The folding display device according to claim 1, wherein the front frame structure further comprises a first flexible part connected between the first front frame part and the second front frame part, a second flexible part connected between the second front frame part and the third front frame part, and a third flexible part connected between the third front frame part and the fourth front frame part.

13. The folding display device according to claim 12, wherein at least one of the first flexible part, the second flexible part, or the third flexible part comprises a hard layer and a soft layer.

14. The folding display device according to claim 13, wherein the soft layer is disposed between the hard layer and the flexible display panel.

15. The folding display device according to claim 14, wherein a plurality of tooth grooves are defined on a side of the hard layer close to the soft layer, and the soft layer is filled in the tooth grooves.

16. The folding display device according to claim 15, wherein a cross-sectional shape of the tooth grooves comprises a square or a triangle.

17. The folding display device according to claim 1, wherein the second support part comprises a plurality of second support sub-parts, and two adjacent second support sub-parts are rotatably connected;
   the second front frame part comprises a plurality of second front frame sub-parts, and each of the second front frame sub-parts is connected to a corresponding second support sub-part;
   the third support part comprises a plurality of third support sub-parts, and two adjacent third support sub-parts are rotatably connected; and
   the third front frame part comprises a plurality of third front frame sub-parts, and each of the third front frame sub-parts is connected to a corresponding third support sub-part.

18. The folding display device according to claim 1, wherein the bending mechanism further comprises a first rotating member and a second rotating member rotatably connected to the bending part, a first torque member connected to the first rotating member and rotating with the first rotating member, a second torque member connected to the second rotating member and rotating with the second rotating member, a first sliding member fixedly connected to the first support part and slidably connected to the first torque member, and a second sliding member fixedly connected to the fourth support part and slidably connected to the second torque member; wherein
   the first sliding member is disposed on a side of the first support part away from the flexible display panel, the first torque member is disposed on a side of the second support part away from the flexible display panel, the second torque member is disposed on a side of the third support part away from the flexible display panel, and the second sliding member is disposed on a side of the fourth support part away from the flexible display panel.

19. The folding display device according to claim 18, wherein the bending mechanism further comprises an intermediate support part movably connected to the bending part, and the intermediate support part is disposed between the bending part and the flexible display panel.

20. A folding display device, comprising:
   a housing comprising a first housing and a second housing;
   a bending mechanism, wherein the bending mechanism is accommodated in the housing and is connected to the first housing and the second housing, and the bending mechanism comprises a bending part, a first support part, and a second support part located on one side of the bending part and are disposed corresponding to the first housing, and a third support part and a fourth support part located on another side of the bending part and are disposed corresponding to the second housing, wherein the first support part is connected to the first housing, the second support part is rotatably connected to one side of the bending part and the first support part, the fourth support part is connected to the second housing, and the third support part is rotatably connected to the another side of the bending part and the fourth support part;
   a flexible display panel, wherein the flexible display panel is disposed in the housing and is located on one side of the first housing, the second housing, and the bending mechanism; and
   a front frame structure disposed on a side of the flexible display panel away from the housing and covering at least a part of a side surface of the flexible display panel, wherein the front frame structure comprises a first front frame part connected to the first support part, a second front frame part connected to the second support part, a third front frame part connected to the third support part, and a fourth front frame part connected to the fourth support part; and
   wherein a first flexible part is connected between the first front frame part and the second front frame part, a second flexible part is connected between the second front frame part and the third front frame part, a third flexible part is connected between the third front frame part and the fourth front frame part, a dust plug is disposed on a side of the second flexible part away from the flexible display panel, and a hook part of the dust plug is pressed on the second flexible part.

* * * * *